(12) United States Patent
Hu et al.

(10) Patent No.: US 11,476,803 B2
(45) Date of Patent: Oct. 18, 2022

(54) OSCILLATING CIRCUIT AND ELECTRONIC DEVICE

(71) Applicants: NO.24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

(72) Inventors: Rongbin Hu, Chongqing (CN); Ziqiang Yi, Chongqing (CN); Gang Zhou, Chongqing (CN); Dong Tang, Chongqing (CN); Ning Tang, Chongqing (CN); Daiguo Xu, Chongqing (CN); Jianan Wang, Chongqing (CN); Guangbing Chen, Chongqing (CN); Dongbing Fu, Chongqing (CN)

(73) Assignees: NO.24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

( * ) Notice: Subject to any disclaimer, the term of this patent is extended or adjusted under 35 U.S.C. 154(b) by 0 days.

(21) Appl. No.: 17/616,642

(22) PCT Filed: Jan. 7, 2020

(86) PCT No.: PCT/CN2020/070585
§ 371 (c)(1),
(2) Date: Dec. 4, 2021

(87) PCT Pub. No.: WO2020/244226
PCT Pub. Date: Dec. 10, 2020

(65) Prior Publication Data
US 2022/0247354 A1    Aug. 4, 2022

(30) Foreign Application Priority Data
Jun. 4, 2019    (CN) .......................... 201910482635.2

(51) Int. Cl.
*H03B 5/24* (2006.01)
*H03K 4/56* (2006.01)
*H03K 3/012* (2006.01)

(52) U.S. Cl.
CPC .............. *H03B 5/24* (2013.01); *H03K 3/012* (2013.01); *H03K 4/56* (2013.01); *H03B 2201/0266* (2013.01)

(58) Field of Classification Search
CPC ..... H03B 5/24; H03B 2201/0266; H03K 4/56
See application file for complete search history.

(56) References Cited

U.S. PATENT DOCUMENTS

| | | | |
|---|---|---|---|
| 6,163,190 A * | 12/2000 | Takai | H03K 3/02337 327/131 |
| 2007/0013455 A1 * | 1/2007 | Roubadia | H03L 7/0995 331/57 |
| 2017/0194944 A1 | 7/2017 | Hernes | |

FOREIGN PATENT DOCUMENTS

| CN | 101394166 A | 3/2009 |
|---|---|---|
| CN | 102045041 A | 5/2011 |

(Continued)

*Primary Examiner* — Jeffrey M Shin
(74) *Attorney, Agent, or Firm* — Global IP Services; Tianhua Gu

(57) ABSTRACT

The present disclosure provides an oscillating circuit and an electronic device; the oscillating circuit includes a capacitor charging and discharging circuit unit, a voltage comparison circuit unit and a threshold voltage generation circuit unit; the oscillating circuit uses the capacitor charging and dis- (Continued)

charging and the hysteresis effect of the capacitor charging and discharging circuit unit to achieve oscillation based on the negative feedback regulation constituted by the voltage comparison circuit unit and the threshold voltage generation circuit unit, which is different from the traditional oscillating circuit based on capacitance and inductance; the oscillating circuit does not adopts inductors, has relatively low power consumption, and outputs oscillation signals with frequencies that vary with currents, and when the oscillating circuit is used to provide clock signals for the sensor, it can be integrated with a sensor signal processing circuit to realize the miniaturization and integration of the sensor system.

12 Claims, 2 Drawing Sheets

(56) References Cited

FOREIGN PATENT DOCUMENTS

| | | |
|---|---|---|
| CN | 110190814 A | 8/2019 |
| JP | 2004253868 A | 9/2004 |

\* cited by examiner

US 11,476,803 B2

OSCILLATING CIRCUIT AND ELECTRONIC DEVICE

CROSS REFERENCE TO RELATED PATENT APPLICATION

The present application is the US national stage of PCT/CN2020/070585 filed on 2020 Jan. 7, which claims the priority of the Chinese patent application No. 201910482635.2 filed on 2019 Jun. 4, which application is incorporated herein by reference.

FIELD OF TECHNOLOGY

The present disclosure relates to the field of integrated circuit/sensor technology, and in particular to an oscillating circuit and electronic device.

BACKGROUND

With the increasing integration and miniaturization of sensors, integrating sensor signal processing circuits with sensors to achieve miniature sensing systems is a trend in the development of sensor technology nowadays, and miniature sensing systems require low power consumption and fewer external signal conditions of sensor signal processing circuits. Therefore, most of these sensor signal processing circuits are integrated with oscillating circuits and do not require external clock signals.

In contrast, conventional oscillating circuits (based on capacitors and inductors) have high power consumption, unstable output frequency, and poor waveforms. In view of this, there is an urgent need for an oscillating circuit with lower power consumption and stable and adjustable output frequency.

SUMMARY

The present disclosure provides a new oscillating circuit such that the oscillating circuit has low power consumption and stable and adjustable output frequency.

To achieve the above purpose and other related purposes, the present disclosure provides an oscillating circuit, including: a capacitor charging and discharging circuit unit, a voltage comparison circuit unit, and a threshold voltage generation circuit unit.

The capacitor charging and discharging circuit unit includes a variable current source, negative current mirrors, positive current mirrors, a first switching transistor, a second switching transistor, and a capacitor, where the variable current source provides a variable current, the capacitor is grounded at one end and connected to a first node at the other end; the negative current mirrors and the first switching transistor mirror the variable current to the first node to charge the capacitor; the positive current mirrors and the second switching transistor mirror the variable current to the first node to discharge the capacitor; a control terminal of the first switching transistor and a control terminal of the second switching transistor are coupled, and the control terminal of the first switching transistor and the control it terminal of the second switching transistor are connected to a second node.

The voltage comparison circuit unit compares and amplifies a voltage difference between a third node and the first node and converts it into a single-ended signal; the single-ended signal is connected to the threshold voltage generating circuit unit, and regulates and controls an output voltage at an output of the threshold voltage generating circuit unit, the output of the threshold voltage generating circuit unit being connected to the third node; the single-ended signal is inverted and connected to the second node, cyclically turning on alternately one of the first switching transistor and the second switching transistor, causing the capacitor to periodically charge and discharge, resulting a sawtooth wave voltage at the first node.

Optionally, the capacitor charging and discharging circuit unit includes a first positive current mirror, a second positive current mirror, and a first negative current mirror, where an input of the first positive current mirror is connected to the variable current source, an output of the first positive current mirror is connected to an input of the first negative current mirror, an output of the first negative current mirror is connected to an input of the first switching transistor, an output of the first switching transistor is connected to the first node; an input of the second positive current mirror is connected to the variable current source, an output of the second positive current mirror is connected to an output of the second switching transistor, an input of the second switching transistor is connected to the first node.

Optionally, the capacitor charging and discharging circuit unit includes a first NMOS transistor, a second NMOS transistor, a third NMOS transistor, a fourth NMOS transistor, a first PMOS transistor, a second PMOS transistor, and a third PMOS transistor, where the first NMOS transistor has a grounded source, the first NMOS transistor has a drain connected to the variable current source, and a gate of the first NMOS transistor is coupled to the drain of the first NMOS transistor.

The second NMOS transistor has a grounded source and a gate connected to the gate of the first NMOS transistor, the second NMOS transistor has a drain connected to a drain of the first PMOS transistor; the first PMOS transistor has a source connected to an operating voltage, the first PMOS transistor has a gate coupled to the drain of the first PMOS transistor; the second PMOS transistor has a source connected to the operating voltage, a gate of the second PMOS transistor is connected to the gate of the first PMOS transistor, and a drain of the second PMOS transistor is connected to a source of the third PMOS transistor; a gate of the third PMOS transistor is connected to the second node, and a drain of the third PMOS transistor is connected to the first node.

The third NMOS transistor has its source grounded, the third NMOS transistor has its gate connected to the gate of the first NMOS transistor, the third NMOS transistor has its drain connected to a source of the fourth NMOS transistor; the fourth NMOS transistor has its gate connected to the second node, the fourth NMOS transistor has its drain connected to the first node.

The first NMOS transistor and the second NMOS transistor form the first positive current mirror to mirror the variable current to the second NMOS transistor, causing the variable current to flow through the first PMOS transistor simultaneously; the first PMOS transistor and the second PMOS transistor form the first negative current mirror to mirror the variable current to the second PMOS transistor, the variable current reaches the first node through the third PMOS transistor, and the third PMOS transistor acts as the first switching transistor; the first NMOS transistor and the third NMOS transistor form the second positive current mirror, mirroring the variable current to the third NMOS transistor, the variable current reaches the first node through the fourth NMOS transistor, and the fourth NMOS transistor acts as the second switching transistor.

Optionally, the second NMOS transistor and the first NMOS transistor have a same width-to-length ratio, the third NMOS transistor and the first NMOS transistor have a same width-to-length ratio, and the second PMOS transistor and the first PMOS transistor have a same width-to-length ratio.

Optionally, the voltage comparison circuit unit includes a differential amplifier and a differential to single-ended circuit unit, the differential amplifier compares and amplifies a voltage difference between the third node and the first node and outputs at a fourth node and a fifth node, the first node is a positive phase terminal with respect to the fifth node, the third node is a positive phase terminal with respect to the fourth node; the differential to single-ended circuit unit amplifies a voltage difference between the fourth node and the fifth node and converts it to the single-ended signal for output at a sixth node.

Optionally, the differential amplifier includes a fifth NMOS transistor, a sixth NMOS transistor, a fourth PMOS transistor, a fifth PMOS transistor and a first tail current source, and the fourth PMOS transistor and the fifth PMOS transistor form a differential pair.

The fourth PMOS transistor has a source connected to the first tail current source, the fourth PMOS transistor has a gate connected to the first node, the fourth PMOS transistor has a drain connected to the fourth node; the fifth NMOS transistor has a drain connected to the fourth node, the fifth NMOS transistor has a gate coupled to its drain, and the fifth NMOS transistor has a source grounded.

The fifth PMOS transistor has a source connected to the first tail current source, the fifth PMOS transistor has a gate connected to the third node, the fifth PMOS transistor has a drain connected to the fifth node; the sixth NMOS transistor has a drain connected to the fifth node, the sixth NMOS transistor has a gate coupled to its drain, the sixth NMOS transistor has a source grounded.

Optionally, the differential to single-ended circuit unit includes a seventh NMOS transistor, an eighth NMOS transistor, a sixth PMOS transistor, and a seventh PMOS transistor.

The sixth PMOS transistor has a source connected to the operating voltage, the sixth PMOS transistor has its gate and drain coupled, the sixth PMOS transistor has its drain connected to a drain of the seventh NMOS transistor; the seventh NMOS transistor has a gate connected to the fourth node, and the seventh NMOS transistor has a source grounded.

The seventh PMOS transistor has a source connected to the operating voltage, the seventh PMOS transistor has a gate connected to a gate of the sixth PMOS transistor, and the seventh PMOS transistor has a drain connected to the sixth node; the eighth NMOS transistor has a source grounded, the eighth NMOS transistor has a gate connected to the fifth node, and the eighth NMOS transistor has a drain connected to the sixth node.

The sixth PMOS transistor and the seventh PMOS form a second negative current mirror, and the second negative current mirror amplifies and converts the voltage difference between the fourth node and the fifth node into the single-ended signal.

Optionally, the threshold voltage generation circuit unit includes an eighth PMOS transistor, a ninth PMOS transistor, a ninth NMOS transistor, an inverter, a resistor, a second tail current source and a current source, the eighth PMOS transistor and the ninth PMOS transistor form a differential pair.

The eighth PMOS transistor has a source connected to the second tail current source, the eighth PMOS transistor has a gate connected to the sixth node, the eighth PMOS transistor has a drain connected to a drain of the ninth NMOS transistor, the ninth NMOS transistor has a gate coupled to its drain, and the ninth NMOS transistor has a source grounded.

A source of the ninth PMOS transistor is connected to the second tail current source, a gate of the ninth PMOS transistor is connected to the second node; a drain of the ninth PMOS transistor is connected to the third node.

An input of the inverter is connected to the sixth node, an output of the inverter is connected to the second node.

One end of the resistor is grounded and the other end of the resistor is connected to the current source through the third node.

Optionally, the oscillating circuit further includes a frequency regulation circuit unit, the frequency regulation circuit unit providing the variable current, controlling a magnitude of the variable current, thereby regulating and controlling a frequency of the sawtooth wave voltage.

Optionally, the frequency regulation circuit unit includes a tenth NMOS transistor, an eleventh NMOS transistor, a twelfth NMOS transistor, a thirteenth NMOS transistor, a fourteenth NMOS transistor, a fifteenth NMOS transistor, a sixteenth NMOS transistor, a seventeenth NMOS transistor, an eighteenth NMOS transistor, a tenth PMOS transistor, an eleventh PMOS transistor, and a reference current source providing a reference current.

The tenth NMOS transistor has a source grounded, the tenth NMOS transistor has a drain connected to the reference current source, the tenth NMOS transistor has a gate coupled to its drain, and the tenth NMOS transistor has its gate connected to a seventh node.

The eleventh NMOS transistor has a source grounded, the eleventh NMOS transistor has a gate connected to the seventh node, the eleventh NMOS transistor has a drain connected to a source of the fifteenth NMOS transistor; the fifteenth NMOS transistor has a gate connected to a first control signal and the fifteenth NMOS transistor has a drain connected to an eighth node.

The twelfth NMOS transistor has a source grounded, the twelfth NMOS transistor has a gate connected to the seventh node, the twelfth NMOS transistor has a drain connected to a source of the sixteenth NMOS transistor; the sixteenth NMOS transistor has a gate connected to a second control signal, the sixteenth NMOS transistor has a drain connected to the eighth node.

The thirteenth NMOS transistor has a source grounded, the thirteenth NMOS transistor has a gate connected to the seventh node, the thirteenth NMOS transistor has a drain connected to a source of the seventeenth NMOS transistor; the seventeenth NMOS transistor has a gate connected to a third control signal, the seventeenth NMOS transistor has a drain connected to the eighth node.

The fourteenth NMOS transistor has a source grounded, the fourteenth NMOS transistor has a gate connected to the seventh node, the fourteenth NMOS transistor has a drain connected to a source of the eighteenth NMOS transistor; the eighteenth NMOS transistor has a gate connected to a fourth control signal, the eighteenth NMOS transistor has a drain connected to the eighth node.

A source of the tenth PMOS transistor is connected to the operating voltage, a gate and a drain of the tenth PMOS transistor are coupled, the drain of the tenth PMOS transistor is connected to the eighth node; a source of the eleventh PMOS transistor is connected to the operating voltage, a gate of the eleventh PMOS transistor is connected to the gate of the tenth PMOS transistor, a drain of the eleventh PMOS transistor outputs the variable current.

Optionally, the eleventh NMOS transistor and the tenth NMOS transistor have a same width-to-length ratio, the twelfth NMOS transistor has a width-to-length ratio two times that of the tenth NMOS transistor, the thirteenth NMOS transistor has a width-to-length ratio four times that of the tenth NMOS transistor, and the fourteenth NMOS transistor has a width-to-length ratio eight times that of the tenth NMOS transistor.

Further, to achieve the above purpose and other related purposes, the present disclosure also provides an electronic device, the electronic device being equipped with an oscillating circuit as described in any of the above items.

As described above, the present disclosure has the following advantages:

1. The oscillating circuit uses the capacitor charging and discharging and the hysteresis effect of the capacitor charging and discharging circuit unit to achieve oscillation based on the negative feedback regulation constituted by the voltage comparison circuit unit and the threshold voltage generation circuit unit, which is different from the traditional oscillating circuit based on capacitance and inductance; the oscillating circuit does not adopts inductance, has relatively low power consumption, and outputs oscillation signals with frequencies that vary with a variable current;

2. The oscillating circuit only uses the capacitor charging and discharging and hysteresis effect to achieve oscillation, and does not use inductors, thus facilitating miniaturization and integration, which can be realized by silicon integration process, and can be integrated with the sensor signal processing circuit, eliminating the need for external clock signals for the sensor signal processing circuit.

REFERENCE NUMERALS

Figure 1:
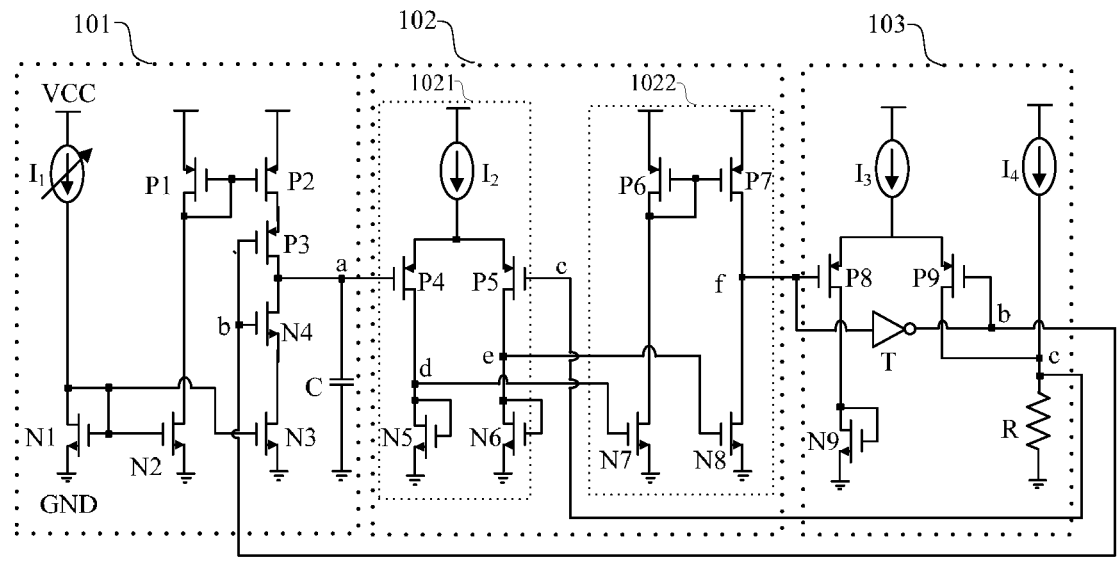
FIG. 1 shows a structure diagram of an oscillating circuit according to Embodiment 1 of the present disclosure.

N1 First NMOS transistor
N2 Second NMOS transistor
N3 Third NMOS transistor
N4 Fourth NMOS transistor
N5 Fifth NMOS transistor
N6 Sixth NMOS transistor
N7 Seventh NMOS transistor
N8 Eighth NMOS transistor
N9 Ninth NMOS transistor
N10 The tenth NMOS transistor
N11 Eleventh NMOS transistor
N12 Twelfth NMOS transistor
N13 Thirteenth NMOS transistor
N14 Fourteenth NMOS transistor
N15 Fifteenth NMOS transistor
N16 Sixteenth NMOS transistor
N17 Seventeenth NMOS transistor
N18 Eighteenth NMOS transistor
P1 First PMOS transistor
P2 Second PMOS transistor
P3 Third PMOS transistor
P4 Fourth PMOS transistor
P5 Fifth PMOS transistor
P6 Sixth PMOS transistor
P7 Seventh PMOS transistor
P8 Eighth PMOS transistor
P9 Ninth PMOS transistor
P10 Tenth PMOS transistor
P11 Eleventh PMOS transistor
C Capacitor
R Resistor
T Inverter
$I_1$ Variable current supplied by variable current source
$I_2$ Current supplied by first tail current source
$I_3$ Current supplied by second tail current source
$I_4$ Current supplied by current source
$I_{ref}$ Current supplied by reference current source
D0 First control signal
D1 First control signal
D2 Third control signal
D3 Fourth control signal
VCC Operating voltage
GND Ground
a First node
b Second node
c Third node
d Fourth node
e Fifth node
f Sixth node
g Seventh node
h Eighth node
101 Capacitor charging/discharging circuit unit
102 Voltage comparison circuit unit
1021 Differential amplifier
1022 Differential to single-ended circuit unit
103 Threshold voltage generation circuit unit
104 Frequency regulation circuit unit

DETAILED DESCRIPTION

As previously mentioned in the background section, most of the conventional oscillating circuits are designed based on capacitors and inductors, which have high power consumption, unstable output frequency and poor waveform, and at the same time, the use of inductors is not conducive to the miniaturization and integration of their structure, and when they are used to provide clock signals for sensors, they are not conducive to the miniaturization and integration of the sensor structure.

Therefore, the present disclosure proposes an oscillating circuit, which uses capacitor charging and discharging and hysteresis effect to achieve oscillation on the basis of negative feedback regulation, and the oscillating circuit does not use inductor, and thus has low power consumption, and the output frequency of the oscillation signal can be adjusted and controlled; at the same time, the oscillating circuit only uses capacitor charging and discharging and hysteresis effect to achieve oscillation, and does not use inductor, and the oscillating circuit is used to provide clock signal for the sensor, so that the oscillating circuit can be integrated with the sensor signal processing circuit to realize the miniaturization and integration of the sensor system.

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure.

Figure 2:
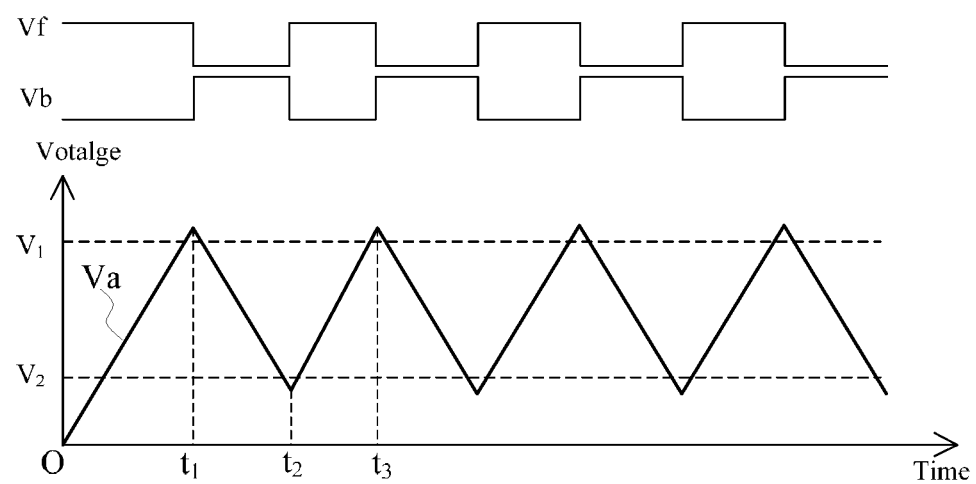
FIG. 2 shows an operating timing diagram of an oscillating circuit according to an embodiment of the present disclosure.
Figure 3:
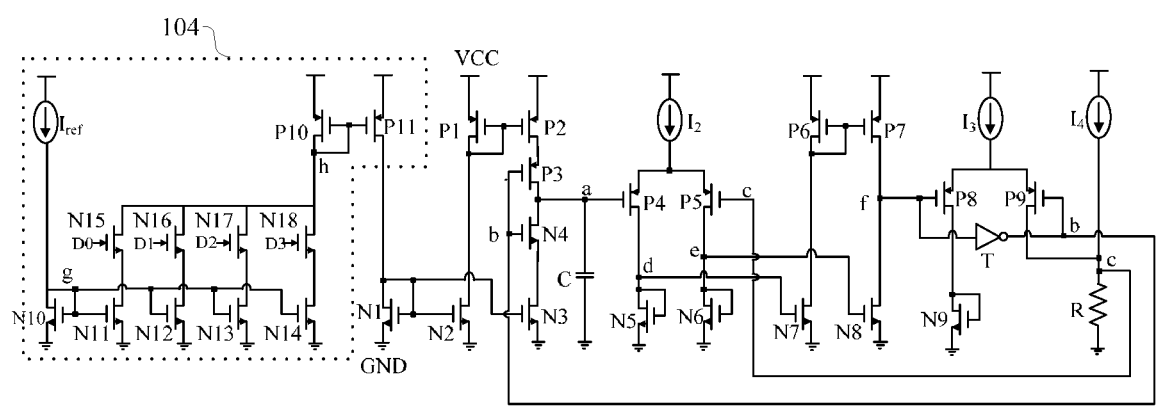
FIG. 3 shows a structure diagram of an oscillating circuit according to Embodiment 2 of the present disclosure.

Please refer to FIG. 1-FIG. 3. It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated. It should be noted that the structure, ratio, size, etc. shown in the accompanying drawings in this specification are only used to illustrate the content disclosed in the specification for the understanding and reading of those familiar with this technology, and are not intended to limit the implementation of the present disclosure. Any structural modification, proportional relationship change or size adjustment should still fall within the scope of the present disclosure, given that no effect and objective achievable by the present disclosure are hindered.

Embodiment 1

FIG. 1 shows a schematic structure of an oscillating circuit of an embodiment of the present disclosure. Referring to FIG. 1, the present disclosure provides an oscillating circuit including: a capacitor charging and discharging circuit unit 101, a voltage comparison circuit unit 102, and a threshold voltage generation circuit unit 103.

The capacitor charging and discharging circuit unit 101 includes a variable current source, negative current mirrors, positive current mirrors, a first switching transistor, a second switching transistor, and a capacitor C; the variable current source provides a variable current $I_1$, and the capacitor C is connected to ground GND at one end and to a first node a at the other end; the negative current mirrors and the first switching transistor mirror the variable current $I_1$ to the first node a to charge the capacitor C; the positive current mirrors and the second switching transistor mirror the variable current $I_1$ to the first node a to discharge the capacitor C; the first switching transistor's control terminal and the second switching transistor's control terminal are coupled and connected to a second node b.

The voltage comparison circuit unit 102 compares and amplifies the voltage difference between the third node c and the first node a and converts it into a single-ended signal; the single-ended signal is connected to the threshold voltage generation circuit unit 103, to regulate and control the output voltage at the output of the threshold voltage generation circuit unit 103, and the output of the threshold voltage generation circuit unit 103 is connected to a third node c; the single-ended signal is inverted and processed, and then connected to the second node b, and one of the first switching transistor and the second switching transistor is cyclically and alternately turned on, causing the capacitor C to be periodically charged and discharged, and a sawtooth wave voltage is resulted at the first node a as an oscillation signal.

Specifically, the capacitor charging and discharging circuit unit 101 includes a first positive current mirror, a second positive current mirror, and a first negative current mirror, where an input of the first positive current mirror is connected to the variable current source, an output of the first positive current mirror is connected to an input of the first negative current mirror, an output of the first negative current mirror is connected to an input of the first switching transistor, an output of the first switching transistor is connected to the first node a; an input of the second positive current mirror is connected to the variable current source, an output of the second positive current mirror is connected to an output of the second switching transistor, an input of the second switching transistor is connected to the first node a.

In more detail, as shown in FIG. 1, the capacitor charging and discharging circuit unit 101 specifically includes a first NMOS transistor N1, a second NMOS transistor N2, a third NMOS transistor N3, a fourth NMOS transistor N4, a first PMOS transistor P1, a second PMOS transistor P2, and a third PMOS transistor P3, the source of the first NMOS transistor N1 is grounded to GND, the drain of the first NMOS transistor N1 is connected to the variable current source, the gate of the first NMOS transistor N1 is coupled to the drain of the first NMOS transistor N1.

The source of the second NMOS transistor N2 is grounded to GND, the gate of the second NMOS transistor N2 is connected to the gate of the first NMOS transistor N1, the drain of the second NMOS transistor N2 is connected to the drain of the first PMOS transistor P1; the source of the first PMOS transistor P1 is connected to the operating voltage VCC, the gate of the first PMOS transistor P1 is coupled to its drain; the source of the second PMOS transistor P2 is connected to the operating voltage VCC, the gate of the second PMOS transistor P2 is connected to the gate of the first PMOS transistor P1, and the drain of the second PMOS transistor P2 is connected to the source of the third PMOS transistor P3; the gate of the third PMOS transistor P3 is connected to the second node b, and the drain of the third PMOS transistor P3 is connected to the first node a.

The source of the third NMOS transistor N3 is grounded to GND, the gate of the third NMOS transistor N3 is connected to the gate of the first NMOS transistor N1, and the drain of the third NMOS transistor N3 is connected to the source of the fourth NMOS transistor N4; the gate of the fourth NMOS transistor N4 is connected to the second node b, and the drain of the fourth NMOS transistor is connected to the first node a;

The first NMOS transistor N1 and the second NMOS transistor N2 form the first positive current mirror, mirroring the variable current $I_1$ to the second NMOS transistor N2, causing the variable current $I_1$ to flow through the first PMOS transistor P1 at the same time, the first PMOS transistor P1 and the second PMOS transistor P2 form the first negative current mirror, mirroring the variable current $I_1$ to the second PMOS transistor P2, with the variable current $I_1$ reaching the first node a through the third PMOS transistor P3, the third PMOS transistor P3 acting as the first switching transistor; the first NMOS transistor N1 and the third NMOS transistor N3 form the second positive current mirror, mirroring the variable current $I_1$ to the third NMOS transistor N3, with the variable current $I_1$ reaching the first node a through the fourth NMOS transistor N4, the fourth NMOS transistor N4 acting as the second switching transistor.

Optionally, the width-to-length ratio of the second NMOS transistor N2 is the same as the width-to-length ratio of the first NMOS transistor N1, the width-to-length ratio of the third NMOS transistor N3 is the same as the width-to-length ratio of the first NMOS transistor N1, and the width-to-length ratio of the second PMOS transistor P2 is the same as the width-to-length ratio of the first PMOS transistor P1, i.e., the current mirroring ratios of the first positive current mirror, the second positive current mirror, and the first negative current mirror are all one, and a charging current and discharging current of the capacitor C are all variable current $I_1$.

In more detail, the voltage comparison circuit unit 102 includes a differential amplifier 1021 and a differential to single-ended circuit unit 1022, the differential amplifier 1021 compares and amplifies a voltage difference between the third node c and the first node a and outputs at a fourth node d and a fifth node e, the first node a is a positive phase terminal with respect to the fifth node e, the third node c is a positive phase terminal with respect to the fourth node d; the differential to single-ended circuit unit 1022 amplifies a voltage difference between the fourth node d and the fifth node e and converts it to the single-ended signal for output at a sixth node f.

In more detail, as shown in FIG. 1, the differential amplifier 1021 includes a fifth NMOS transistor N5, a sixth NMOS transistor N6, a fourth PMOS transistor P4, a fifth PMOS transistor P5, and a first tail current source. The fourth PMOS transistor P4 and the fifth PMOS transistor P5 form a differential pair; the source of the fourth PMOS transistor P4 is connected to the first tail current source, the gate of the fourth PMOS transistor P4 is connected to the first node a, the drain of the fourth PMOS transistor P4 is connected to the fourth node d; the drain of the fifth NMOS transistor N5 is connected to the fourth node d, the gate of the fifth NMOS transistor N5 is coupled to the drain of the fifth NMOS transistor N5, the source of the fifth NMOS transistor N5 is grounded to GND; the source of the fifth PMOS transistor P5 is connected to the first tail current source, the gate of the fifth PMOS transistor P5 is connected to the third node c, the drain of the fifth PMOS transistor P5 is connected to the fifth node e; the drain of the sixth NMOS transistor N6 is connected to the fifth node e, the gate of the sixth NMOS transistor N6 is coupled to the drain of the sixth NMOS transistor N6, and the source of the sixth NMOS transistor N6 is grounded to GND.

In more detail, the differential to single-ended circuit unit 1022 includes a seventh NMOS transistor N7, an eighth NMOS transistor N8, a sixth PMOS transistor P6 and a seventh PMOS transistor P7; the source of the sixth PMOS transistor P6 is connected to the operating voltage VCC, the gate of the sixth PMOS transistor P6 is coupled to its drain, and the drain of the sixth PMOS transistor P6 is connected to the drain of the seventh NMOS transistor N7; the NMOS transistor N7 has a gate connected to the fourth node d, the source of the seventh NMOS transistor N7 is grounded to GND; the source of the seventh PMOS transistor P7 is connected to the operating voltage VCC, the gate of the seventh PMOS transistor P7 is connected to the gate of the sixth PMOS transistor P6, the drain of the seventh PMOS transistor P7 is connected to the sixth node f; the source of the eighth NMOS transistor N8 is grounded, the gate of the eighth NMOS transistor N8 is connected to the fifth node e, and the drain of the eighth NMOS transistor is connected to the sixth node f; the sixth PMOS transistor P6 and the seventh PMOS transistor P7 form a second negative current mirror, and the voltage difference between the fourth node d and the fifth node e is amplified and converted into the single-ended signal through the second negative current mirror, and amplified and output at the sixth node f.

As shown in FIG. 1, in the voltage comparison circuit unit 102, the single-ended signal output at the sixth node f is low when the voltage of the first node a is higher than the voltage of the third node c, and the single-ended signal output at the sixth node f is high when the voltage of the first node a is lower than the voltage of the third node c.

In detail, as shown in FIG. 1, the threshold voltage generation circuit unit 103 includes an eighth PMOS transistor P8, a ninth PMOS transistor P9, a ninth NMOS transistor N9, an inverter T, a resistor R, a second tail current source and a current source; the eighth PMOS transistor P8 and the ninth PMOS transistor P9 form a differential pair; the source of the eighth PMOS transistor P8 is connected to the second tail current source, the gate of the eighth PMOS transistor P8 is connected to the sixth node f, the drain of the eighth PMOS transistor P8 is connected to the drain of the ninth NMOS transistor N9, the gate of the ninth NMOS transistor N9 is coupled to its drain, the source of the ninth NMOS transistor N9 is grounded to GND; the source of the ninth PMOS transistor P9 is connected to the second tail current source, the gate of the ninth PMOS transistor P9 is connected to the second node b, the drain of the ninth PMOS transistor P9 is connected to the third node c; the input of the inverter T is connected to the sixth node f, and the output of the inverter T is connected to the second node b; one end of the resistor R is grounded to GND, and the other end of the resistor R is connected to the current source through the third node c.

As shown in FIG. 1, when the single-ended signal output from the sixth node f is high, the output of the inverter T is low, causing the eighth PMOS transistor P8 to turn off and the ninth PMOS transistor P9 to turn on, and the current $I_3$ provided by the second tail current source flows through the ninth PMOS transistor P9 to the resistor R. The current $I_3$ provided by the second tail current source and the current $I_4$ provided by the current source flow through the resistor R, generating at the third node c a first threshold voltage $V_1$ given by:

$$V_1 = R_1(I_3 + I_4) \quad (1)$$

When the single-ended signal output from the sixth node f is low, the output of the inverter T is high, causing the eighth PMOS transistor P8 to turn on and the ninth PMOS transistor P9 to turn off; the current $I_3$ provided by the second tail current source flows through the eighth PMOS transistor P8 to the ninth NMOS transistor N9, and only the current $I_4$ provided by the current source flows across the resistor R, generating at the third node c a second threshold voltage $V_2$ given by:

$$V_2 = R_1 I_4 \quad (2)$$

In equations (1) and (2), R1 denotes the resistance value of the resistor R.

More specifically, the operation of the oscillating circuit as shown in FIG. 1 is as follows.

As shown in FIG. 2, which shows the operating timing diagram of the oscillating circuit of the embodiment of the present disclosure, and in combination with FIG. 1, assuming that the voltage Va of the first node a at the moment 0 is the ground potential (zero level), and since the voltage Vc of the third node c is one of the first threshold voltage $V_1$ and the second threshold voltage $V_2$, the voltage Va of the first node a is significantly lower than the voltage Vc of the third node c. The single-ended signal output at the sixth node f is high and the voltage Vc of the third node c has a same value of the first threshold voltage $V_1$; at the same time, the inverter T outputs a low level and acts on the second node b, causing the third PMOS transistor P3 to turn on and the fourth NMOS transistor N4 to turn off, and the third PMOS transistor P3 charges the capacitor C with a current with a magnitude equal to the variable current $I_1$, and the voltage Va of the first node a increases at a slope $K_1$ given by:

$$K_1 = \frac{I_1}{C_1} \quad (3)$$

When the voltage Va of the first node a exceeds the first threshold voltage V1, as shown in FIG. 2 at the moment $t_1$, the voltage Va of the first node a is significantly higher than the voltage Vc of the third node c. Thereafter, the single-ended signal output by the sixth node f changes from high to low and the voltage Vc of the third node c has a value of the second threshold voltage V2; at the same time, the inverter T outputs a high level and acts on the second node b to cause the third PMOS transistor P3 to turn off and the fourth NMOS transistor N4 to turn on, and the fourth NMOS transistor N4 discharges the capacitor C with a current with a magnitude equal to the variable current $I_1$, and the voltage Va of the first node a decreases with a slope $K_2$ given by:

$$K_2 = \frac{I_1}{C_1} \quad (4)$$

When the voltage Vc of the first node a drops below the second threshold voltage $V_2$, as shown in FIG. 2 at the moment $t_2$, the voltage Va of the first node a is lower than the voltage Vc of the third node c. Thereafter, the single-ended signal output by the sixth node f changes from low to high and the voltage Vc of the third node c has a value of the first threshold voltage at the same time, the inverter T outputs a low level, the third PMOS transistor P3 is turned on and the fourth NMOS transistor N4 is turned off, the third PMOS transistor P3 charges the capacitor C with a current with a magnitude equal to the variable current $I_1$, and the voltage Va of the first node a increases with a slope $K_1$. Thereafter, the voltage Va of the first node a alternately increases and decreases with slopes $K_1$ and $K_2$ respectively between the second threshold voltage $V_2$ and the first threshold voltage $V_1$, forming a sawtooth wave as shown in FIG. 2. At the same time, the waveform of the voltage Vb at the second node b and the single-ended signal Vf output from the sixth node f are approximated as rectangular waves as shown in FIG. 2.

According to the above analysis, it can be seen that the oscillating circuit in an embodiment of the present disclosure uses capacitor charging and discharging and hysteresis effects to achieve oscillation on the basis of negative feedback, without using inductors, and the overall power consumption is low. Based on the structural design, the oscillation signal of the sawtooth waveform can be obtained at the first node a, and the oscillation period of the oscillation signal is given by:

$$T = \frac{(V_1 - V_2)C_1}{I_1} \quad (5)$$

In Eq. (3)-Eq. (5), T denotes the oscillation period of this oscillation signal, and $C_1$ denotes the capacitance value of capacitor C. From equation (5), it can be seen that changing the magnitude of the adjustable variable current $I_1$ can change the oscillation period T or the oscillation frequency, and the output frequency of this oscillation signal can be regulated.

Optionally, in an embodiment of the present disclosure, it is also possible to change the charging current and the discharging current of the capacitor C by adjusting current mirror ratios of the first positive current mirror, the second positive current mirror, and the first negative current mirror, and thus adjusting the waveform and frequency of the sawtooth wave voltage at the first node a.

In addition, the present disclosure provides an electronic device, equipped with the oscillating circuit. When the oscillating circuit is used to provide clock signals to a sensor signal processing circuit on the electronic device, since the oscillating circuit utilizes only components such as MOS transistors, capacitors and resistors, and does not employ inductors, the oscillating circuit can be integrated with the sensor signal processing circuit using a silicon integration process to achieve miniaturization and integration of the sensor system, while realizing an electronic device with a miniaturized structure.

Embodiment 2

Based on the idea of "changing the oscillation period T by changing the magnitude of the variable current $I_1$", in an embodiment of the present disclosure, the oscillating circuit of embodiment 1 is supplemented and extended, as shown in FIG. 3, which shows a schematic structure of the oscillating circuit of an embodiment of the present disclosure, and on the basis of embodiment 1, the oscillating circuit further includes a frequency regulation circuit unit 104, acting as the variable current source to provide a variable current $I_1$ of adjustable magnitude, and controlling the magnitude of the variable current $I_1$ by adjusting the frequency regulation circuit unit 104, thereby adjusting the frequency of the sawtooth wave voltage at the first node a, i.e., adjusting the output frequency of the oscillation signal.

In detail, as shown in FIG. 3, the frequency regulation circuit unit 104 includes a tenth NMOS transistor N10, an eleventh NMOS transistor N11, a twelfth NMOS transistor N12, a thirteenth NMOS transistor N13, a fourteenth NMOS transistor N14, a fifteenth NMOS transistor N15, a sixteenth NMOS transistor N16, a seventeenth NMOS transistor N17, an eighteenth NMOS transistor N18, a tenth PMOS transistor P10, an eleventh PMOS transistor P11, and a reference current source providing a reference current $I_{ref}$, which may be generated by an accurate reference circuit and a bias circuit on the chip.

The source of the tenth NMOS transistor N10 is grounded to GND, the drain of the tenth NMOS transistor N10 is connected to the reference current source, the gate of the tenth NMOS transistor N10 is coupled to its drain, and the gate of the tenth NMOS transistor N10 is connected to the seventh node g.

The source of the eleventh NMOS transistor N11 is grounded to GND, the gate of the eleventh NMOS transistor N11 is connected to the seventh node g, and the drain of the eleventh NMOS transistor N11 is connected to the source of the fifteenth NMOS transistor N15, the gate of the fifteenth NMOS transistor N15 is connected to a first control signal D0, and the drain of the fifteenth NMOS transistor N15 is connected to the eighth node h.

The source of the twelfth NMOS transistor N12 is grounded to GND, the gate of the twelfth NMOS transistor N12 is connected to the seventh node g, the drain of the twelfth NMOS transistor N12 is connected to the source of the sixteenth NMOS transistor N16; the gate of the sixteenth NMOS transistor N16 is connected to a second control signal D1, the drain of the sixteenth NMOS transistor N16 is connected to the eighth node h.

The source of the thirteenth NMOS transistor N13 is grounded to GND, the gate of the thirteenth NMOS transistor N13 is connected to the seventh node g, and the drain of the thirteenth NMOS transistor N13 is connected to the source of the seventeenth NMOS transistor N17, the gate of the seventeenth NMOS transistor N17 is connected to the third control signal D2, and the drain of the seventeenth NMOS transistor N17 is connected to the eighth node h.

The source of the fourteenth NMOS transistor N14 is grounded to GND, the gate of the fourteenth NMOS transistor N14 is connected to the seventh node g, the drain of the fourteenth NMOS transistor N14 is connected to the source of the eighteenth NMOS transistor N18, the gate of the eighteenth NMOS transistor N18 is connected to the fourth control signal D3, the drain of the eighteenth NMOS transistor N18 is connected to the eighth node h.

The source of the tenth PMOS transistor P10 is connected to the operating voltage VCC, the gate of the tenth PMOS transistor P10 is coupled to its drain, and the drain of the tenth PMOS transistor P10 is connected to the eighth node h; the source of the eleventh PMOS transistor P11 is connected to the operating voltage VCC, the gate of the eleventh PMOS transistor P11 is connected to the gate of the tenth PMOS transistor P10, and the drain of the eleventh PMOS transistor P11 output the variable current $I_1$.

The tenth NMOS transistor N10 forms positive current mirrors along with the eleventh NMOS transistor N11, the twelfth NMOS transistor N12, the thirteenth NMOS transistor N13, and the fourteenth NMOS transistor N14 respectively, mirroring the reference current $I_{ref}$ proportionally to the eleventh NMOS transistor N11, the twelfth NMOS transistor N12, the thirteenth NMOS transistor N13, and the fourteenth NMOS N14. The first control signal D0, the second control signal D1, the third control signal D2, and the fourth control signal D3 control the turn-on and turn-off of the fifteenth NMOS transistor N15, the sixteenth NMOS transistor N16, the seventeenth NMOS transistor N17, and the eighteenth NMOS transistor N18, respectively, thereby controlling the current supplied to the tenth PMOS transistor P10, the tenth PMOS transistor P10 and the eleventh PMOS transistor P11 form a negative current mirror, which mirrors the current to the eleventh PMOS transistor P11 as a variable current $I_1$ to charge or discharge the capacitor C.

Optionally, the eleventh NMOS transistor N11 and the tenth NMOS transistor N10 have a same width-to-length ratio, the twelfth NMOS transistor N12 has a width-to-length ratio two times that of the tenth NMOS transistor N10, the thirteenth NMOS transistor N13 has a width-to-length ratio four times that of the tenth NMOS transistor N10, and the fourteenth NMOS transistor N14 has a width-to-length ratio eight times that of the tenth NMOS transistor N10.

It should be noted that the current mirror ratio (i.e., the ratio of the width-to-length ratios of two MOS transistors in a current mirror) of each current mirror in this embodiment of the present disclosure can be adjusted and set as desired.

In an embodiment of the present disclosure, multiple current mirrors and multiple control signals (the first control signal D0, the second control signal D1, the third control signal D2 and the fourth control signal D3) can be adjusted and controlled to amplify the reference current $I_{ref}$ by multiple times as needed, as variable current I4, i.e., the magnitude of the variable current $I_4$ can be adjusted and controlled, and thus the output frequency of the oscillating circuit of the present disclosure is adjustable.

In summary, the oscillating circuit of the embodiment of the present disclosure uses the capacitor charging and discharging and hysteresis effect of the capacitor charging and discharging circuit unit to achieve oscillation on the basis of the negative feedback regulation composed of the voltage comparison circuit unit and the threshold voltage generation circuit unit. Different from the traditional capacitor-inductor-based oscillating circuit, the oscillating circuit of the present disclosure does not use an inductor and has lower power consumption, and the output frequency of the oscillation signal is related to the variable current. At the same time, the oscillating circuit of the present disclosure only uses the capacitor charging and discharging and hysteresis effect to achieve oscillation, and does not use inductors, which is convenient for miniaturization and integration, and when the oscillating circuit is used to provide clock signals for the sensor, it can be integrated with a sensor signal processing circuit to achieve miniaturization and integration of the sensor system.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. An oscillating circuit, comprising: a capacitor charging and discharging circuit unit, a voltage comparison circuit unit, and a threshold voltage generation circuit unit;
    wherein the capacitor charging and discharging circuit unit comprises a variable current source, negative current mirrors, positive current mirrors, a first switching transistor, a second switching transistor, and a capacitor, wherein the variable current source provides a variable current, the capacitor is grounded at one end and connected to a first node at the other end; the negative current mirrors and the first switching transistor mirror the variable current to the first node to charge the capacitor; the positive current mirrors and the second switching transistor mirror the variable current to the first node to discharge the capacitor; a control terminal of the first switching transistor and a control terminal of the second switching transistor are coupled, and the control terminal of the first switching transistor and the control terminal of the second switching transistor are connected to a second node;
    wherein the voltage comparison circuit unit compares and amplifies a voltage difference between a third node and the first node and converts it into a single-ended signal; the single-ended signal is connected to the threshold voltage generation circuit unit, and regulates and controls an output voltage at an output of the threshold voltage generation circuit unit, the output of the threshold voltage generation circuit unit being connected to the third node; the single-ended signal is inverted and connected to the second node; one of the first switching transistor and the second switching transistor is cyclically and alternately turned on, causing the capacitor to be periodically charged and discharged, resulting a sawtooth wave voltage at the first node.

2. The oscillating circuit according to claim 1, wherein the capacitor charging and discharging circuit unit comprises a first positive current mirror, a second positive current mirror, and a first negative current mirror, wherein an input of the first positive current mirror is connected to the variable current source, an output of the first positive current mirror is connected to an input of the first negative current mirror, an output of the first negative current mirror is connected to an input of the first switching transistor, an output of the first switching transistor is connected to the first node; an input of the second positive current mirror is connected to the variable current source, an output of the second positive current mirror is connected to an output of the second switching transistor, an input of the second switching transistor is connected to the first node.

3. The oscillating circuit according to claim 2, wherein the capacitor charging and discharging circuit unit comprises a first NMOS transistor, a second NMOS transistor, a third NMOS transistor, a fourth NMOS transistor, a first PMOS transistor, a second PMOS transistor, and a third PMOS transistor, wherein the first NMOS transistor has a grounded source, the first NMOS transistor has a drain connected to the variable current source, and a gate of the first NMOS transistor is coupled to the drain of the first NMOS transistor;

wherein the second NMOS transistor has a grounded source and a gate connected to the gate of the first NMOS transistor, the second NMOS transistor has a drain connected to a drain of the first PMOS transistor; the first PMOS transistor has a source connected to an operating voltage, the first PMOS transistor has a gate coupled to the drain of the first PMOS transistor; the second PMOS transistor has a source connected to the operating voltage, a gate of the second PMOS transistor is connected to the gate of the first PMOS transistor, and a drain of the second PMOS transistor is connected to a source of the third PMOS transistor; a gate of the third PMOS transistor is connected to the second node, and a drain of the third PMOS transistor is connected to the first node;

wherein the third NMOS transistor has its source grounded, the third NMOS transistor has its gate connected to the gate of the first NMOS transistor, the third NMOS transistor has its drain connected to a source of the fourth NMOS transistor; the fourth NMOS transistor has its gate connected to the second node, the fourth NMOS transistor has its drain connected to the first node;

wherein the first NMOS transistor and the second NMOS transistor form the first positive current mirror to mirror the variable current to the second NMOS transistor, causing the variable current to flow through the first PMOS transistor simultaneously; the first PMOS transistor and the second PMOS transistor form the first negative current mirror to mirror the variable current to the second PMOS transistor, the variable current reaches the first node through the third PMOS transistor, and the third PMOS transistor acts as the first switching transistor; the first NMOS transistor and the third NMOS transistor forming the second positive current mirror, mirroring the variable current to the third NMOS transistor, the variable current reaches the first node through the fourth NMOS transistor, and the fourth NMOS transistor acts as the second switching transistor.

4. The oscillating circuit according to claim 3, wherein the second NMOS transistor and the first NMOS transistor have a same width-to-length ratio, the third NMOS transistor and the first NMOS transistor have a same width-to-length ratio, and the second PMOS transistor and the first PMOS transistor have a same width-to-length ratio.

5. The oscillating circuit according to claim 3, wherein the voltage comparison circuit unit comprises a differential amplifier and a differential to single-ended circuit unit, the differential amplifier compares and amplifies a voltage difference between the third node and the first node and outputs at a fourth node and a fifth node, the first node is a positive phase terminal with respect to the fifth node, the third node is a positive phase terminal with respect to the fourth node; the differential to single-ended circuit unit amplifies a voltage difference between the fourth node and the fifth node and converts it into the single-ended signal for output at a sixth node.

6. The oscillating circuit according to claim 5, wherein the differential amplifier comprises a fifth NMOS transistor, a sixth NMOS transistor, a fourth PMOS transistor, a fifth PMOS transistor and a first tail current source, and the fourth PMOS transistor and the fifth PMOS transistor form a differential pair;

wherein the fourth PMOS transistor has a source connected to the first tail current source, the fourth PMOS transistor has a gate connected to the first node, the fourth PMOS transistor has a drain connected to the fourth node; the fifth NMOS transistor has a drain connected to the fourth node, the fifth NMOS transistor has a gate coupled to its drain, and the fifth NMOS transistor has a source grounded;

wherein the fifth PMOS transistor has a source connected to the first tail current source, the fifth PMOS transistor has a gate connected to the third node, the fifth PMOS transistor has a drain connected to the fifth node; the sixth NMOS transistor has a drain connected to the fifth node, the sixth NMOS transistor has a gate coupled to its drain, the sixth NMOS transistor has a source grounded.

7. The oscillating circuit according to claim 6, wherein the differential to single-ended circuit unit comprises a seventh NMOS transistor, an eighth NMOS transistor, a sixth PMOS transistor, and a seventh PMOS transistor;

wherein the sixth PMOS transistor has a source connected to the operating voltage, the sixth PMOS transistor has its gate and drain coupled, the sixth PMOS transistor has its drain connected to a drain of the seventh NMOS transistor; the seventh NMOS transistor has a gate connected to the fourth node, and the seventh NMOS transistor has a source grounded;

wherein the seventh PMOS transistor has a source connected to the operating voltage, the seventh PMOS transistor has a gate connected to a gate of the sixth PMOS transistor, and the seventh PMOS transistor has a drain connected to the sixth node; the eighth NMOS transistor has a source grounded, the eighth NMOS transistor has a gate connected to the fifth node, and the eighth NMOS transistor has a drain connected to the sixth node;

wherein the sixth PMOS transistor and the seventh PMOS form a second negative current mirror, and the second negative current mirror amplifies and converts the voltage difference between the fourth node and the fifth node into the single-ended signal.

8. The oscillating circuit according to claim 7, wherein the threshold voltage generation circuit unit comprises an eighth PMOS transistor, a ninth PMOS transistor, a ninth NMOS transistor, an inverter, a resistor, a second tail current source and a current source, and the eighth PMOS transistor and the ninth PMOS transistor form a differential pair;

wherein the eighth PMOS transistor has a source connected to the second tail current source, the eighth PMOS transistor has a gate connected to the sixth node, the eighth PMOS transistor has a drain connected to a drain of the ninth NMOS transistor, the ninth NMOS transistor has a gate coupled to its drain, and the ninth NMOS transistor has a source grounded;

wherein a source of the ninth PMOS transistor is connected to the second tail current source, a gate of the ninth PMOS transistor is connected to the second node, a drain of the ninth PMOS transistor is connected to the third node;

wherein an input of the inverter is connected to the sixth node, an output of the inverter is connected to the second node;

wherein one end of the resistor is grounded and the other end of the resistor is connected to the current source through the third node.

9. The oscillating circuit according to claim 1, wherein the oscillating circuit further comprises a frequency regulation circuit unit, the frequency regulation circuit unit providing the variable current, controlling a magnitude of the variable current, thereby regulating and controlling a frequency of the sawtooth wave voltage.

10. The oscillating circuit according to claim 9, wherein the frequency regulation circuit unit comprises a tenth NMOS transistor, an eleventh NMOS transistor, a twelfth NMOS transistor, a thirteenth NMOS transistor, a fourteenth NMOS transistor, a fifteenth NMOS transistor, a sixteenth NMOS transistor, a seventeenth NMOS transistor, an eighteenth NMOS transistor, a tenth PMOS transistor, an eleventh PMOS transistor, and a reference current source providing a reference current;

wherein the tenth NMOS transistor has a source grounded, the tenth NMOS transistor has a drain connected to the reference current source, the tenth NMOS transistor has a gate coupled to its drain, and the tenth NMOS transistor has its gate connected to a seventh node;

wherein the eleventh NMOS transistor has a source grounded, the eleventh NMOS transistor has a gate connected to the seventh node, the eleventh NMOS transistor has a drain connected to a source of the fifteenth NMOS transistor; the fifteenth NMOS transistor has a gate connected to a first control signal, and the fifteenth NMOS transistor has a drain connected to an eighth node;

wherein the twelfth NMOS transistor has a source grounded, the twelfth NMOS transistor has a gate connected to the seventh node, the twelfth NMOS transistor has a drain connected to a source of the sixteenth NMOS transistor; the sixteenth NMOS transistor has a gate connected to a second control signal, the sixteenth NMOS transistor has a drain connected to the eighth node;

wherein the thirteenth NMOS transistor has a source grounded, the thirteenth NMOS transistor has a gate connected to the seventh node, the thirteenth NMOS transistor has a drain connected to a source of the seventeenth NMOS transistor; the seventeenth NMOS transistor has a gate connected to a third control signal, the seventeenth NMOS transistor has a drain connected to the eighth node;

wherein the fourteenth NMOS transistor has a source grounded, the fourteenth NMOS transistor has a gate connected to the seventh node, the fourteenth NMOS transistor has a drain connected to a source of the eighteenth NMOS transistor; the eighteenth NMOS transistor has a gate connected to a fourth control signal, the eighteenth NMOS transistor has a drain connected to the eighth node;

wherein a source of the tenth PMOS transistor is connected to an operating voltage, a gate and a drain of the tenth PMOS transistor are coupled, the drain of the tenth PMOS transistor is connected to the eighth node; a source of the eleventh PMOS transistor is connected to the operating voltage, a gate of the eleventh PMOS transistor is connected to the gate of the tenth PMOS transistor, a drain of the eleventh PMOS transistor outputs the variable current.

11. The oscillating circuit according to claim 10, wherein the eleventh NMOS transistor and the tenth NMOS transistor have a same width-to-length ratio, the twelfth NMOS transistor has a width-to-length ratio two times that of the tenth NMOS transistor, the thirteenth NMOS transistor has a width-to-length ratio four times that of the tenth NMOS transistor, and the fourteenth NMOS transistor has a width-to-length ratio eight times that of the tenth NMOS transistor.

12. An electronic device comprising the oscillating circuit of claim 1.

* * * * *